US011766735B2

(12) United States Patent
Dessart et al.

(10) Patent No.: US 11,766,735 B2
(45) Date of Patent: Sep. 26, 2023

(54) MODULAR WELDING SYSTEM

(71) Applicant: Illinois Tool Works Inc., Glenview, IL (US)

(72) Inventors: Nicholas James Dessart, Appleton, WI (US); Ryan Lawrence Peterson, Appleton, WI (US); Nicholas Alexander Matiash, Oshkosh, WI (US); Michael Allen Sammons, Appleton, WI (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 0 days.

(21) Appl. No.: 17/889,697

(22) Filed: Aug. 17, 2022

(65) Prior Publication Data

US 2023/0048019 A1    Feb. 16, 2023

Related U.S. Application Data

(63) Continuation of application No. 16/031,733, filed on Jul. 10, 2018, now Pat. No. 11,524,357, which is a
(Continued)

(51) Int. Cl.
*B23K 9/32*        (2006.01)
*B23K 9/10*        (2006.01)
(Continued)

(52) U.S. Cl.
CPC ............ *B23K 9/327* (2013.01); *B23K 9/1006* (2013.01); *B23K 9/133* (2013.01); *B23K 9/323* (2013.01);
(Continued)

(58) Field of Classification Search
CPC ...... B23K 37/02; B23K 9/1006; B23K 9/133; B23K 9/323; B23K 9/327; B23K 9/32;
(Continued)

(56) References Cited

U.S. PATENT DOCUMENTS 2,871,440 A    1/1959   Hart
3,335,468 A    8/1967   Harley
(Continued)

FOREIGN PATENT DOCUMENTS

AT    510560      5/2012
CN    2289360     8/1998
(Continued)

OTHER PUBLICATIONS

International Search Report for PCT application No. PCT/US2013/058583 dated Mar. 12, 2014, 9 pgs.
(Continued)

*Primary Examiner* — Dana Ross
*Assistant Examiner* — James F Sims, III
(74) *Attorney, Agent, or Firm* — McAndrews, Held & Malloy, Ltd.

(57) ABSTRACT

A welding system includes power conversion circuitry configured to convert input power to weld power and a first housing surface. The first housing surface includes a first mating geometry configured to mate with a first complementary geometry of a first modular surface of a first modular component of the welding system.

20 Claims, 7 Drawing Sheets

Related U.S. Application Data continuation of application No. 13/841,872, filed on Mar. 15, 2013, now Pat. No. 10,046,411.

(60) Provisional application No. 61/698,068, filed on Sep. 7, 2012.

(51) Int. Cl.
  *B23K 9/133* (2006.01)
  *B23K 37/02* (2006.01)
  *H05K 5/00* (2006.01)
  *H05K 7/14* (2006.01)

(52) U.S. Cl.
  CPC ............ *B23K 37/02* (2013.01); *H05K 5/0021* (2013.01); *H05K 7/1432* (2013.01); *Y10T 29/49826* (2015.01)

(58) Field of Classification Search
  CPC ...... B23K 9/12; H05K 5/0021; H05K 7/1432; Y10T 29/49826
  USPC .................................................. 361/600, 728
  See application file for complete search history.

(56) References Cited

U.S. PATENT DOCUMENTS

| | | | |
|---|---|---|---|
| 5,050,760 A | 9/1991 | Garcia | |
| 5,106,248 A | 4/1992 | Harris | |
| 5,169,218 A | 12/1992 | Chu | |
| 5,189,277 A | 2/1993 | Boisvert | |
| 5,317,795 A | 6/1994 | Bolton | |
| 5,444,897 A | 8/1995 | Gross | |
| 5,607,608 A | 3/1997 | Feldhausen | |
| 5,725,324 A | 3/1998 | Pavelski | |
| 5,734,148 A | 3/1998 | Latvis | |
| 5,747,773 A | 5/1998 | Griffin | |
| 5,797,639 A | 8/1998 | Zorzenon | |
| 6,039,500 A | 3/2000 | Kwon | |
| 6,062,663 A | 5/2000 | You | |
| 6,129,429 A | 10/2000 | Hardt | |
| 6,132,019 A | 10/2000 | Kim | |
| 6,232,576 B1 | 5/2001 | Bankstahl | |
| 6,242,691 B1 | 6/2001 | Reese | |
| 6,489,591 B1 | 12/2002 | Achtner | |
| 6,531,683 B1* | 3/2003 | Lawrence | B23K 37/02 219/125.11 |
| 6,661,648 B2 | 12/2003 | Dayley | |
| 6,721,183 B1 | 4/2004 | Chen | |
| 6,764,259 B1 | 7/2004 | Preta | |
| 7,176,411 B2* | 2/2007 | Enyedy | B23K 9/1336 242/129.5 |
| 7,288,740 B2 | 10/2007 | Radtke | |
| 7,306,273 B2 | 12/2007 | Estes | |
| 7,389,900 B2 | 6/2008 | Matiash | |
| 7,456,373 B2 | 11/2008 | Andersen | |
| 8,070,242 B2 | 12/2011 | Makabe | |
| 8,238,118 B2 | 8/2012 | Li | |
| 2002/0074911 A1 | 6/2002 | Chen | |
| 2002/0135192 A1 | 9/2002 | William | |
| 2003/0081399 A1 | 5/2003 | Davis | |
| 2003/0098383 A1 | 5/2003 | Luo | |
| 2003/0136773 A1 | 7/2003 | Bogner | |
| 2003/0155339 A1 | 8/2003 | Gitter | |
| 2004/0196623 A1 | 10/2004 | Erickson | |
| 2005/0023943 A1 | 2/2005 | Fan | |
| 2006/0238973 A1 | 10/2006 | Sun | |
| 2006/0285289 A1 | 12/2006 | Jones | |
| 2008/0116177 A1 | 5/2008 | Hutchison | |
| 2009/0057285 A1 | 3/2009 | Bashore | |
| 2010/0084387 A1 | 4/2010 | Bender | |
| 2010/0147817 A1 | 6/2010 | Laitala | |
| 2010/0224607 A1 | 9/2010 | Hutchison | |
| 2011/0017717 A1 | 1/2011 | Farah | |
| 2011/0220627 A1 | 9/2011 | Buday | |
| 2011/0297414 A1 | 12/2011 | Chen | |
| 2012/0017819 A1 | 1/2012 | Cleveland | |
| 2012/0068041 A1 | 3/2012 | Flattinger | |
| 2014/0070683 A1 | 3/2014 | Peterson | |

FOREIGN PATENT DOCUMENTS

| | | |
|---|---|---|
| CN | 2641991 | 9/2004 |
| CN | 2739926 | 11/2005 |
| CN | 201226132 | 4/2009 |
| CN | 201644419 | 11/2010 |
| CN | 201755727 | 3/2011 |
| CN | 202043391 | 11/2011 |
| CN | 102271474 | 12/2011 |
| CN | 202185669 | 4/2012 |
| CN | 102581320 | 7/2012 |
| DE | 1129639 | 5/1962 |
| DE | 1916881 | 6/1965 |
| DE | 2002156 | 8/1971 |
| DE | 8806453 | 10/1988 |
| DE | 9211696 | 3/1993 |
| GB | 1157968 | 7/1969 |
| JP | S6453774 | 3/1989 |
| JP | H06506637 | 7/1994 |
| KR | 1020070005893 | 1/2007 |
| WO | 9217310 | 10/1992 |
| WO | 2008106419 | 9/2008 |
| WO | 2010132905 | 11/2010 |

OTHER PUBLICATIONS

International Search Report from PCT application No. PCT/US2013/058101 dated Apr. 30, 2014, 14 pgs.
International Search Report from PCT application No. PCT/US2013/058104 dated Apr. 30, 2014, 14 pgs.
International Search Report from PCT application No. PCT/US2013/058106 dated Jan. 27, 2014, 9 pgs.
International Search Report from PCT application No. PCT/US2013/058347 dated Apr. 30, 2014, 15 pgs.

* cited by examiner

MODULAR WELDING SYSTEM

CROSS-REFERENCE TO RELATED APPLICATION

This application claims priority to, and is a continuation of, co-pending U.S. Non-Provisional application Ser. No. 16/031,733, entitled "MODULAR WELDING SYSTEM," filed Jul. 10, 2018, which is a continuation of U.S. Non-Provisional application Ser. No. 13/841,872, entitled "MODULAR WELDING SYSTEM," filed Mar. 15, 2013, which claims priority from and the benefit of U.S. Provisional Application Ser. No. 61/698,068, entitled "MODULAR WELDING SYSTEM," filed Sep. 7, 2012, all of which are hereby incorporated by reference in their entirety for all purposes.

BACKGROUND

The present invention relates generally to the field of welding systems, and more particularly to a modular welding system that can be packaged as a complete system or a partial system.

Welding systems generally have a power supply that applies electrical current to an electrode so as to pass an arc between the electrode and a work piece, thereby heating the electrode and work piece to create a weld. In many systems, the electrode consists of a wire that is advanced through a welding torch by a wire feeder. Various components of a complete welding system may supply the wire, apply the electrical current, and cool the system. However, a complete welding system does not provide any flexibility to a purchaser to purchase just the desired components. Additionally, individual components may be inconvenient to transport.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In one embodiment, a welding system includes power conversion circuitry configured to convert input power to weld power and a first housing surface. The first housing surface includes a first mating geometry configured to mate with a first complementary geometry of a first modular surface of a first modular component of the welding system.

In another embodiment, a welding system includes a wire feeder having a wire drive configured to supply a welding wire to a torch and a wire feeder housing disposed about the wire drive. The wire feeder housing includes a mating geometry configured to mate with a complementary geometry of a modular component of the welding system. The modular component includes a swivel, a welding power supply, a torch cooler, or a transportation device, or any combination thereof.

In another embodiment, a method includes interfacing a first housing surface of a first modular component with a second housing surface of a first power supply. The first modular component includes a wire feeder, a swivel, or a cooler. The first housing surface includes a first mating geometry and the second housing surface includes a first complementary geometry configured to mate with the first mating geometry. The method also includes coupling the first modular component to the first power supply via a first mating relationship between the first mating geometry and the first complementary geometry.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
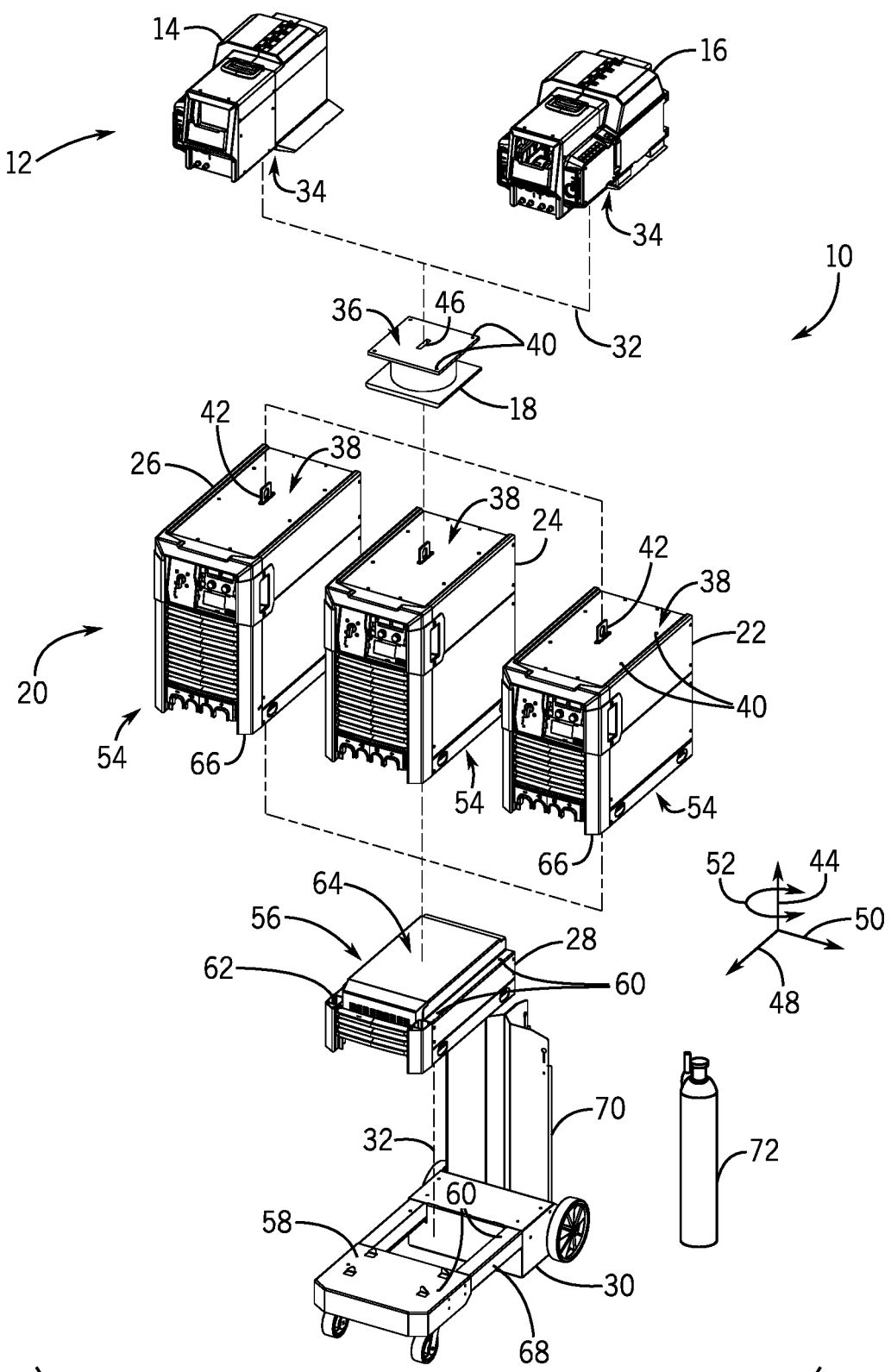
FIG. 1 is an assembly view of an embodiment of the modular welding system.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The presently disclosed modular welding system embodiments may include one or more modular components with housings having mating geometries that interface with complementary mating geometries on the housings of opposing modular components. The modular welding system may include, but is not limited to, a wire feeder (e.g., single-wire, dual-wire), a power supply (e.g., primary switching or inverter power supply, transformer-based power supply), a torch cooler, or a transportation device (e.g., cart), or any combination thereof. The components of the modular welding system may be removably coupled to one another via the mating geometries. Coupling the modular component may limit the relative movement between the modular components. Some of the mating geometries may include, but are not limited to interlocking (e.g., nesting) housing geometries, mounting hardware on the housings, shared fastener locations relative to a surface of the housings, and the like. For example, some embodiments of modular components (e.g., power supplies) may have housings with slots, grooves, holes, or recessed portions to receive extension portions (e.g., flanges, posts, hooks) of an interfacing modular component (e.g., wire feeder). Some embodiments of the modular welding system may have housings with shared patterns of mating feature locations among the components, thereby reducing the complexity of removably coupling the modular component to one another. In some embodiments, the mating geometries may passively and/or removably couple modular components without utilizing tools (e.g., screw driver, wrench, etc.).

In some embodiments, the modular components may be rotatably coupled to one another, thereby limiting relative translation motion and permitting some relative rotational motion, such as between the wire feeder and the power supply. Removably coupling the modular components to one another enables the operator to configure the modular welding system for a particular welding application utilizing only the selected modular components. The modular components may be coupled so that the modular welding system has flush surfaces (e.g., vertical surfaces such as the front, sides, rear surfaces) between the modular components, which may reduce snags and/or reduce a dimension (e.g., width, length) of the modular welding system. In some embodiments, the modular components may be removably coupled in a vertical stack, thereby reducing a footprint of the welding system.

Turning to the figures, FIG. 1 is an assembly view of an embodiment of a modular welding system 10 showing multiple modular components that may be coupled together. The modular components may include, but are not limited to, a wire feeder 12 (e.g., single-wire wire feeder 14, a dual-wire wire feeder 16), a swivel 18, a power supply 20 (e.g., a first inverter power supply 22, a second inverter power supply 24, a transformer power supply 26, a torch cooler 28, and a transportation device 30. As may be appreciated, the wire feeder 12 may have a spool of welding wire (e.g., electrode) and a wire drive to supply the welding wire to a torch for a welding application (e.g., metal inert gas (MIG) welding). In some embodiments, the welding wire may be a solid, hollow, or flux-cored welding wire. The power supply 20 has power conversion circuitry that receives input power from a power source, and converts the input power to weld power suitable for the welding application. The wire feeder 12 and the power supply 20 may be communicatively coupled by signal cables and/or weld cables. In some embodiments, the power supply 20 supplies weld power to the wire feeder 12 to perform the welding application.

The dashed lines 32 of FIG. 1 illustrate an embodiment of a configuration for coupling the modular components together in the modular welding system 10. As discussed below, some modular components (e.g., swivel 18, torch cooler 28, transportation device 30) may be omitted from some embodiments of the modular welding system 10. Additionally, some embodiments may couple one wire feeder 12 (e.g., single-wire wire feeder 14) and/or one power supply 20 (e.g., first inverter power supply 22) in a modular welding system, and leave any additionally wire feeders 12 (e.g., dual-wire wire feeder 16) and/or power supplies 20 (e.g., second inverter power supply 24) to be available for use in other welding systems (e.g., another modular welding system 10). Additional modular components may be utilized as replacement modular components that are switched with active modular components for maintenance. Accordingly, the modular components may be removably coupled in various combinations based at least in part on an operator's desired welding application. For example, the operator may not utilize a wire feeder 12 for a stick welding application or a tungsten inert gas (TIG) welding application, or the operator may elect to forgo the torch cooler 28 for a relatively short duration welding application.

A wire feeder bottom housing 34 may be removably coupled to a first housing surface 36 of the swivel 16 or to a second housing surface 38 of a power supply 20. The wire feeder bottom housing 34 has a first mating geometry, and both the first and second housing surfaces 36, 38 have a first complementary geometry that couples with the first mating geometry. In some embodiments, the wire feeder bottom housing 34 and the first or second housing surfaces 36, 38 share a first hole pattern 40 (e.g., bolt holes) to accommodate fasteners. A lift eye 42 or other structure may extend from the second housing surface 38 of the power supply 20 along a vertical axis (e.g., Y-axis 44) to mate with a recess 46 of the swivel 18 and/or the wire feeder 12. The lift eye 42 may facilitate positioning the wire feeder 12 and/or the swivel 18 relative to the power supply 20. For example, faces of the wire feeder 12 and/or the swivel 18 may be aligned with or spaced apart (e.g., set back) from faces of the power supply 20 utilizing the lift eye 42. In some embodiments, the power supply 20 may removably couple with the swivel 18 and/or the wire feeder 12 along a horizontal axis (e.g., X-axis 48, Z-axis 50) via a channel and mating flange as discussed in detail below. Moreover, the wire feeder bottom housing 34 may interlock (e.g., nest) with the first housing surface 36 and second housing surface 38. The wire feeder bottom housing 34 may be removably coupled to the first housing surface 36 and/or second housing surface 38, thereby limiting movement of the wire feeder 12 along the coordinate axes 44, 48, 50 relative to the power supply 20.

The swivel 18 may enable the wire feeder 12 to rotate relative to power supply 20. For example, the swivel 18 enables the wire feeder 12 to rotate about the vertical axis 44 as shown by arrow 52. Rotation of the wire feeder 12 via the swivel 18 to direct the wire from the wire feeder 12 in the direction of the torch may reduce stresses on the wire and/or wire feeder 12. During operation, the swivel 18 may enable the operator to move along the horizontal axis 48, 50 relative to the modular welding system 10 without deforming the wire. In some embodiments, the wire feeder 12 and first housing surface 36 of the swivel 18 may rotate about the horizontal axes 48, 50 relative to the power supply 20. In some embodiments, the swivel 18 may be considered to be a part of the wire feeder 12 or the power supply 20. As discussed below, coupling the wire feeder 12 to the power supply 20 may include a separate swivel 18 coupled between the wire feeder 12 and the power supply 20. In some embodiments, the wire feeder 12 is rotatably coupled to the power supply 20.

A power supply bottom housing 54 may be removably coupled to a third housing surface 56 of the cooler 28 and/or to a fourth housing surface 58 of the transportation device 30. The power supply bottom housing 54 has a second mating geometry, and both the third and fourth housing surfaces 56, 58 have a second complementary geometry that couples with the second mating geometry. The power supply bottom housing 54 may be removably coupled to the third housing surface 56 and/or the fourth housing surface 58, thereby limiting movement of the cooler 28 or transportation device 30 along the coordinate axes 44, 48, 50 relative to the power supply 20. In some embodiments, the second mating geometry is substantially the same as the first mating geometry, and the second complementary geometry is substantially the same as the first complementary geometry. The similar first and second mating geometries may increase the modularity and interchangeability of the modular welding system.

In some embodiments, the power supply bottom housing 54 and the third or fourth housing surfaces 56, 58 share a second hole pattern 60 (e.g., bolt holes) to accommodate fasteners. Embodiments in which the second hole pattern 60 is the first hole pattern 40 may increase the modularity of the modular welding system 10. In some embodiments, the power supply bottom housing 54 may interlock (e.g., nest) with the third or fourth housing surfaces 56, 58. For example, the third and fourth housing surfaces 56, 58 may have a recessed portion 62 (e.g., perimeter) and a raised portion 64 (e.g., interior), and the power supply bottom housing 54 may have one or more legs 66 (e.g., rails along the perimeter) that extend from the bottom surface of the power supply 20. The recessed portion 62 of the cooler 28 or the transportation device 30 may receive the one or more legs 66 (e.g., rails), and the bottom surface receives the raised portion 64.

The transportation device 30 may removably couple with components of the modular welding system 10, such as the wire feeder 12, the power supply 20 and/or the cooler 28. In some embodiments, supports 68 of the transportation device 30 extend and retract along the X-axis 48 to accommodate differently sized modular components. A rack 70 of the transportation device 30 may receive and secure one or more fluid storage tanks 72 (e.g., cylinders, bottles) for the modular welding system 10. In some embodiments, the storage tanks 72 may supply shielding gas for a welding operation, fuel for a cutting operation, coolant for the cooler 28, or any combination thereof.

In some embodiments of the modular welding system 10, the housings of the modular components (e.g., wire feeder 12, swivel 18, power supply 20, cooler 28, transportation device 30) have male top surfaces and female bottom surfaces. In other embodiments, the housings of the modular components of the modular welding system 10 may have female top surfaces and male bottom surfaces, or any combination thereof that may enable the modular components to interchangeably couple with one another in a modular manner. Moreover, the wire feeder 12 may removably couple with the power supply 20 via a first mating relationship (e.g., flange and channel, first nesting geometry, first hole pattern), and the cooler 28 and/or transportation device may removably couple with the power supply 20 via a second mating relationship (e.g., e.g., flange and channel, second nesting geometry, second hole pattern). In some embodiments, the first mating relationship is interchangeable with the second mating relationship, thereby facilitating the arrangement of the modular components in various configurations of the modular welding system 10. For example, the cooler 28 may be coupled between the wire feeder 12 and the power supply 20.

As described above and shown in FIG. 1, the modular welding system 10 may have multiple configurations of the modular components. Some of the components, such as the wire feeder 12 and power supply 20, may have multiple form factors with varying capacities or options available to the operator. Table 1 is set forth below to list some of the various configurations of the modular welding system 10. The components of each of the configurations may be removably coupled to one another as shown in FIG. 1, or in another arrangement as the mating geometries may permit.

TABLE 1

Configurations of modular welding components in the modular welding system 10.

| | Modular Component | | | | | | | |
|---|---|---|---|---|---|---|---|---|
| | 12 | | | 20 | | | | |
| Configuration | 14 | 16 | 18 | 22 | 24 | 26 | 28 | 30 |
| 1 | | | | X | | X | | |
| 2 | | | | X | | | | X |
| 3 | | | | X | | | X | X |
| 4 | | | | | X | | X | |
| 5 | | | | | X | | | X |
| 6 | | | | | X | | X | X |
| 7 | | | | | | X | X | |
| 8 | | | | | | X | | X |
| 9 | | | | | | X | X | X |
| 10 | X | | | X | | | | |
| 11 | X | | X | X | | | | |
| 12 | X | | X | X | | | X | |
| 13 | X | | X | X | | | | X |
| 14 | X | | X | X | | | X | X |
| 15 | X | | | X | | | X | |
| 16 | X | | | X | | | X | X |
| 17 | X | | | X | | | | X |
| 18 | X | | | | X | | | |
| 19 | X | | X | | X | | | |
| 20 | X | | X | | X | | X | |
| 21 | X | | X | | X | | | X |
| 22 | X | | X | | X | | X | X |
| 23 | X | | | | X | | X | |
| 24 | X | | | | X | | X | X |
| 25 | X | | | | X | | | X |
| 26 | X | | | | | X | | |
| 27 | X | | X | | | X | | |
| 28 | X | | X | | | X | X | |
| 29 | X | | X | | | X | | X |
| 30 | X | | X | | | X | X | X |
| 31 | X | | | | | X | X | |
| 32 | X | | | | | X | X | X |
| 33 | X | | | | | X | | X |
| 34 | | X | | X | | | | |
| 35 | | X | X | X | | | | |
| 36 | | X | X | X | | | X | |
| 37 | | X | X | X | | | | X |
| 38 | | X | X | X | | | X | X |
| 39 | | X | | X | | | X | |
| 40 | | X | | X | | | X | X |
| 41 | | X | | X | | | | X |
| 42 | | X | | | X | | | |
| 43 | | X | X | | X | | | |
| 44 | | X | X | | X | | X | |
| 45 | | X | X | | X | | | X |
| 46 | | X | X | | X | | X | X |
| 47 | | X | | | X | | X | |
| 48 | | X | | | X | | X | X |
| 49 | | X | | | X | | | X |
| 50 | | X | | | | X | | |
| 51 | | X | X | | | X | | |
| 52 | | X | X | | | X | X | |
| 53 | | X | X | | | X | | X |
| 54 | | X | X | | | X | X | X |
| 55 | | X | | | | X | X | |
| 56 | | X | | | | X | X | X |
| 57 | | X | | | | X | | X |

Figure 2:
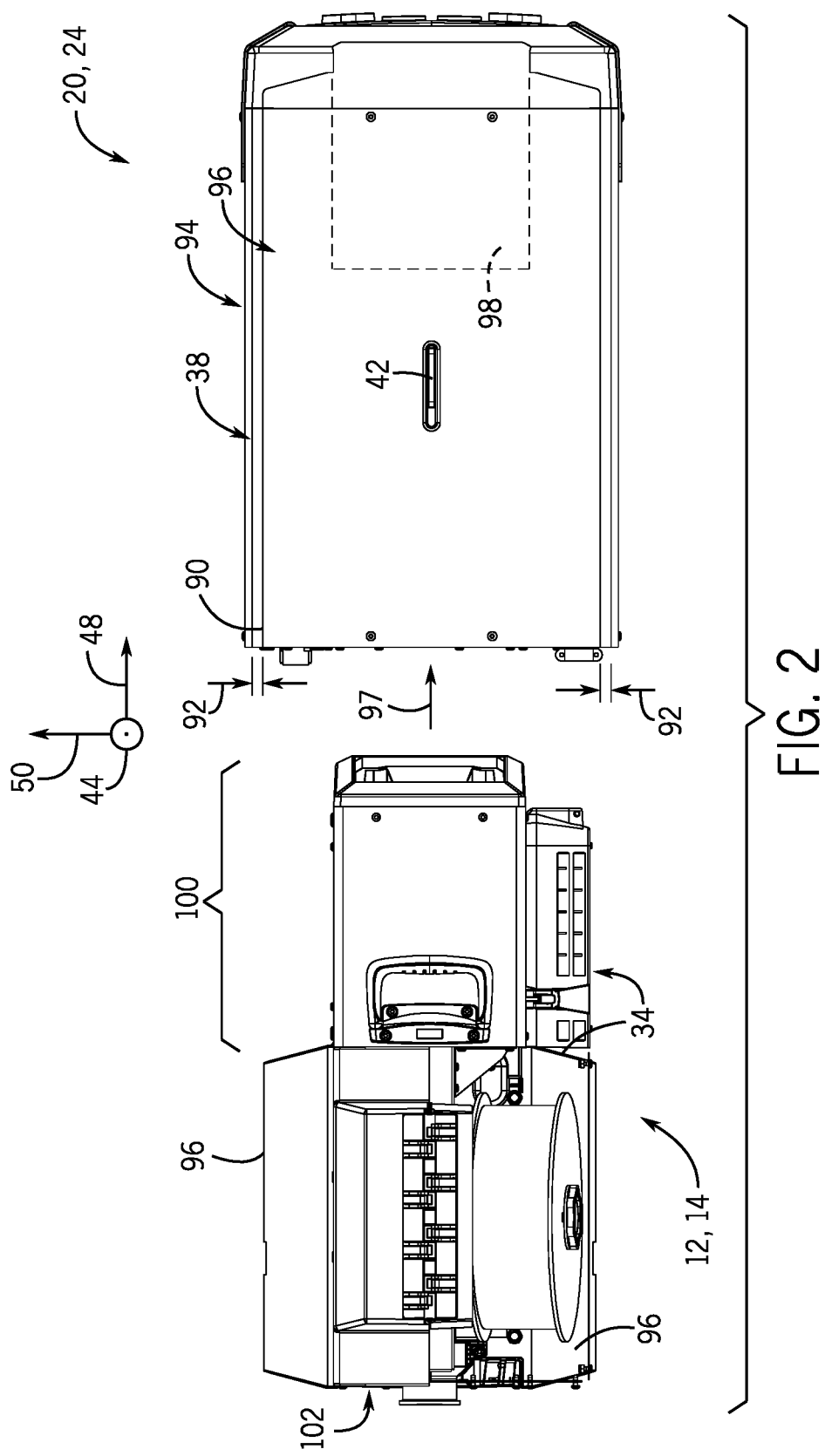
FIG. 2 is a top view of an embodiment of a power supply and a wire feeder of the modular welding system of FIG. 1.

FIG. 2 illustrates a top-view of an embodiment of the wire feeder 12 (e.g., single-wire wire feeder 14) and the power supply 20 (e.g., second inverter power supply 24). In some embodiments, the second housing surface 38 of the power supply 20 has a rim 90 raised along the vertical axis 44 from an interior 96. When a modular component (e.g., wire feeder 12, swivel 18) interfaces with the interior 96 of the second housing surface 38, the rim 90 (e.g., lip) may block movement of the modular component in one or more horizontal directions 48, 50 relative to the power supply 20. In some embodiments, the rim 90 that forms a channel 92 between the rim 90 and an interior 96 of the second housing surface 96. The rim 90 may substantially lie along a portion of a perimeter 94 of the power supply 20, or the rim 90 may lie within the interior 96 of the second housing surface 38. In some embodiments, one or more flanges 96 of the wire feeder bottom housing 34 may be inserted (e.g., arrow 97) into the channel 92 to removably couple the wire feeder 12 to the second housing surface 38 of the power supply 20. A flange 96 of the swivel 18 coupled to the feeder 12 may also be inserted into the channel 92. In other embodiments, the rim 90 and channel 92 are on the wire feeder bottom housing 34 and removably receive one or more flanges 96 of the second housing surface 38 of the power supply 20.

The wire feeder bottom housing 34 and the second housing surface 38 may have mating complementary shapes that facilitate removably coupling the modular components. For example, the flanges 96 of the wire feeder 12 may interface with the rim 90 of the power supply 20, and a receiving portion 98 of the second housing surface 38 may receive a front portion 100 (e.g., input panel) of the wire feeder 12. The receiving portion 98 may be recessed in the second housing surface 38 and configured to seat the front portion 100. Seating the front portion 100 may stabilize the wire feeder 12. In some embodiments, the second housing surface 38 of the power supply 20 removably couples with and positions the wire feeder 12 so that one or more faces of the wire feeder 12 are positioned with a desired spacing relative to one or more faces of the power supply 20. For example, the second housing surface 38 may couple with the wire feeder bottom housing 34 so that the rear face 102 of the wire feeder 12 is substantially flush with the rear face 104 of the power supply 20.

Figure 3:
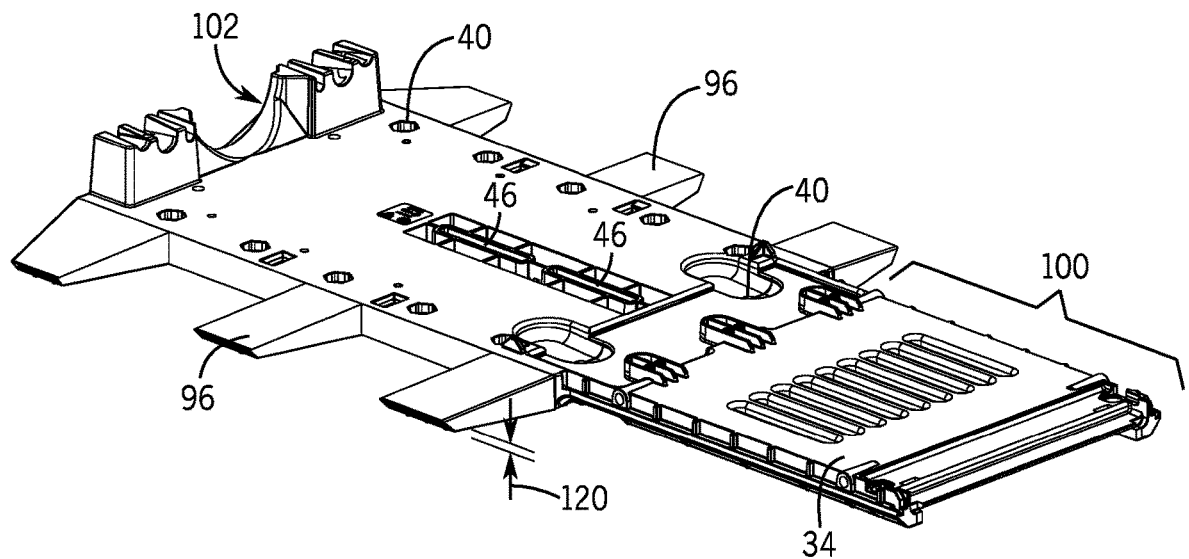
FIG. 3 is a perspective view of an embodiment of a bottom housing of the wire feeder of FIG. 2 having a first mating geometry.
Figure 4:
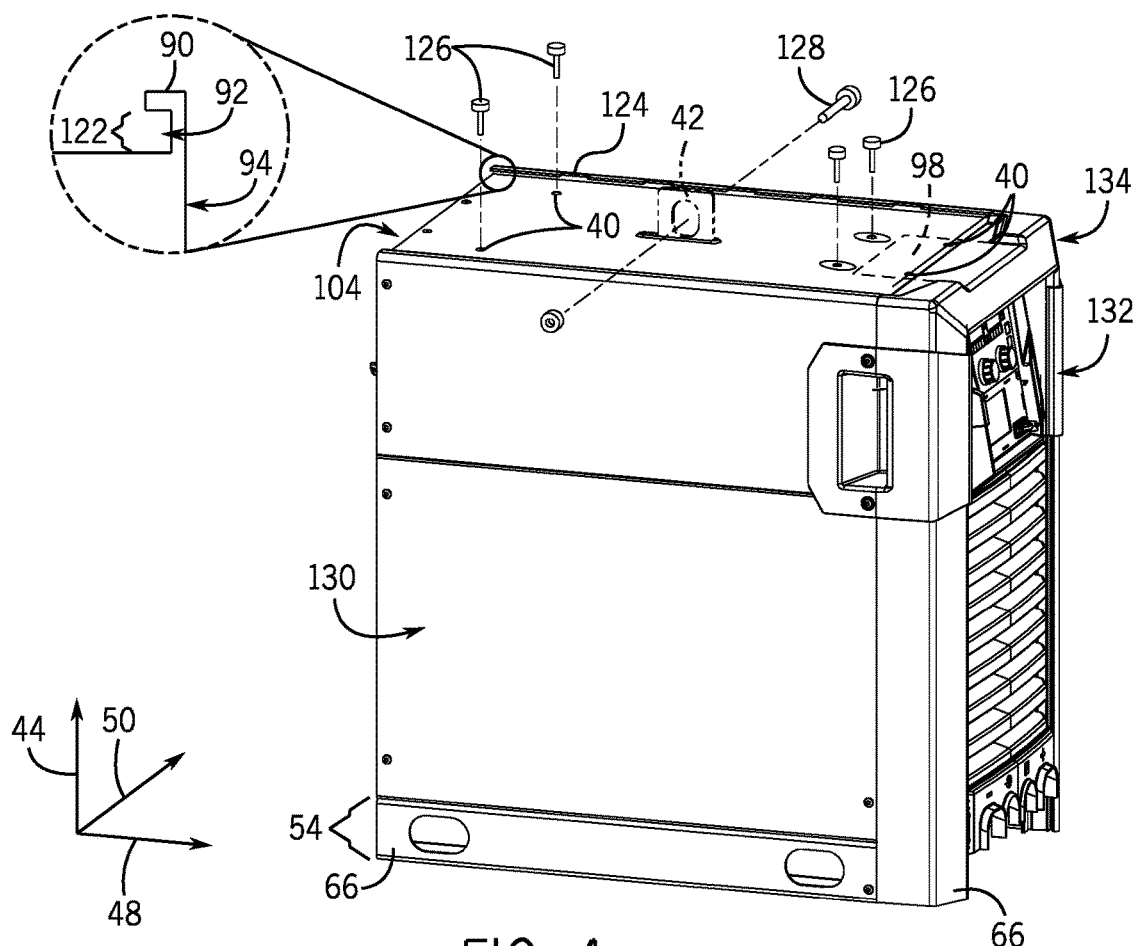
FIG. 4 is a perspective view of an embodiment of the power supply of FIG. 2 with a top surface having a first complementary geometry to mate with the first mating geometry shown in FIG. 3.

FIG. 3 illustrates a perspective view of an embodiment of the wire feeder bottom housing 34. FIG. 4 illustrates a perspective view of an embodiment of the power supply 20 with various mating features. FIGS. 3 and 4 are discussed together to clarify the various mating relationships of the modular components of the modular welding system 10. In some embodiments of the wire feeders 12, the wire feeder bottom housing 34 may be common between the single-wire wire feeder 14 and the dual-wire wire feeder 16. Thus, a second mating surface 38 of the power supply 20 configured to couple with the single-wire wire feeder 14 may also couple with a the dual-wire wire feeder 16. Additionally, the swivel 18 may have a geometry similar to the wire feeder bottom housing 34, facilitating the coupling of the swivel 18 between the wire feeder 12 and the power supply 20. Accordingly, the discussion below related to the wire feeder bottom housing 34 may also pertain to embodiments of the swivel 18.

Embodiments of the wire feeder bottom housing 34 with flanges 96 may have a flange thickness 120 that is less than or approximately equal to a channel height 122. In some embodiments, the wire feeder bottom housing 34 may be coupled to the second housing surface 38 along a horizontal axis, such as the X-axis 48 from the rear face 104 of the power supply 20 as shown in FIG. 2 (e.g., arrow 97). In other embodiments, the one or more flanges 96 may be tabs along the length (e.g., X-axis 48), and the rim 90 may have multiple openings 124. The tabs 96 may be inserted along the vertical axis 44 to interface with the second housing surface 38. The wire feeder 12 may then translate (e.g., slide) along a horizontal axis 48, 50 to engage the flanges 96 (e.g., tabs) within the channel 92 of the second housing surface 38.

In some embodiments, the first hole pattern 40 extends through the wire feeder bottom housing 34 and the second housing surface 38. As may be appreciated, various fasteners 126 (e.g., bolts, screws, clips, and so forth) may extend through the first hole pattern 40 of both housings (e.g., wire feeder bottom housing 34, second housing surface 38) to removably attach the wire feeder 12 to the power supply 20. The fasteners 126 may be inserted with or without the use of tools (e.g., screwdriver, wrench). The first hole pattern 40 may be common to any of the modular components, such as the wire feeder bottom housings 34 of the single-wire wire feeder 14 and the dual-wire wire feeder 16, the first housing surface 36 of the swivel 18, the second housing surface 38 of the power supply 20, or any combination thereof.

The power supply 20 may have a lift eye 42 to facilitate transport of the power supply 20. The lift eye 42 may extend from the second housing surface 38 along the vertical axis 44. The lift eye 42 may be utilized to position modular components (e.g., wire feeder 12, swivel 18) on the second housing surface 38. In some embodiments, the wire feeder bottom housing 34 has one or more recesses 46 (e.g., slots) to receive the lift eye 42 when the wire feeder 12 is positioned on the second housing surface 38 of the power supply 20. A bolt 128 or other fastener may extend through the lift eye 42 to secure the wire feeder bottom portion 34 to the second housing surface 38 along the vertical axis 44. The lift eye 42 and recesses 46 may facilitate positioning the wire feeder 12 relative to the power supply 20 along the horizontal axes 48, 50. The lift eye 42 may be fixed to the power supply 20 at a certain horizontal position relative to vertical surfaces, such as a rear surface 104, a right surface 130, a front surface 132, and a left surface 134. Accordingly, aligning the recess 46 with the lift eye 42 may position the wire feeder 12 relative to the power supply 20 based at least in part on the certain position. Accordingly, multiple recesses 46, as shown in FIG. 3, may enable the wire feeder 12 to be removably coupled to the second housing surface 38 in multiple positions. For example, placing the lift eye 42 through a first recess may align the rear surfaces 102, 104, and placing the lift eye 42 through a second recess may offset the rear surfaces 102, 104.

Figure 5:
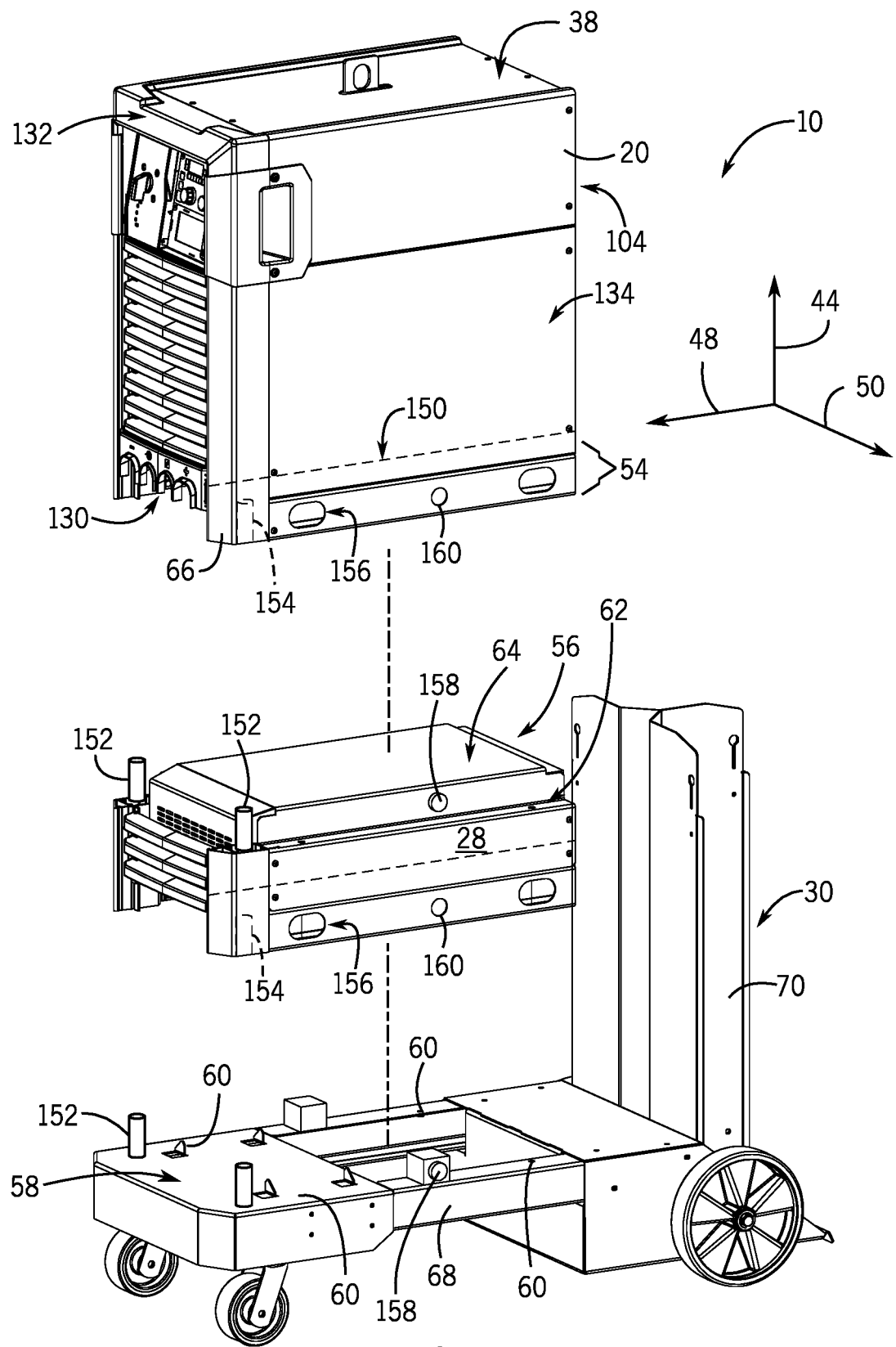
FIG. 5 is a perspective view of an embodiment of the modular welding system and one or more mating features between components of the modular welding system.
Figure 6:
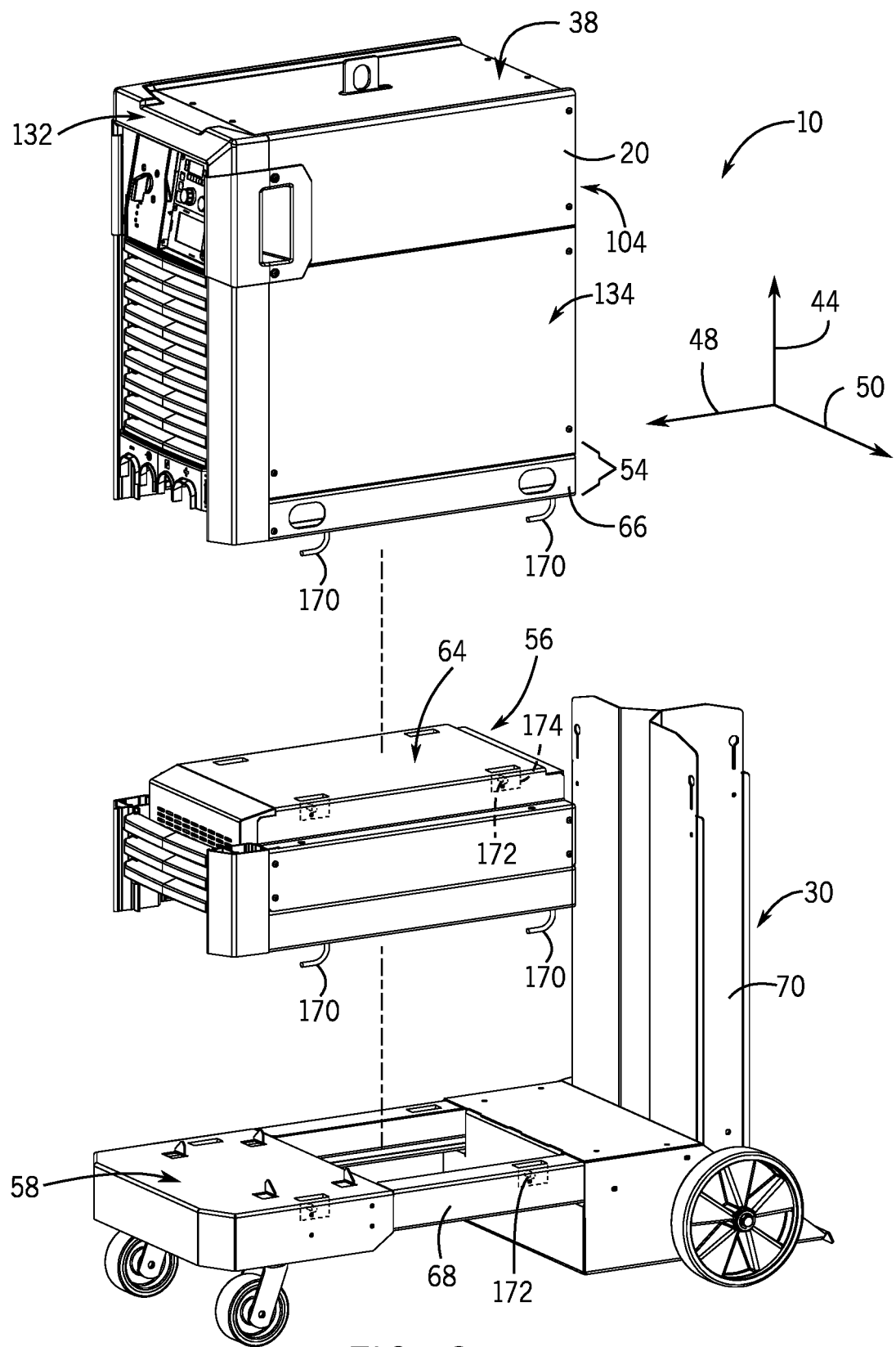
FIG. 6 is a perspective view of an embodiment of the modular welding system and one or more mating features between components of the modular welding system.
Figure 7:
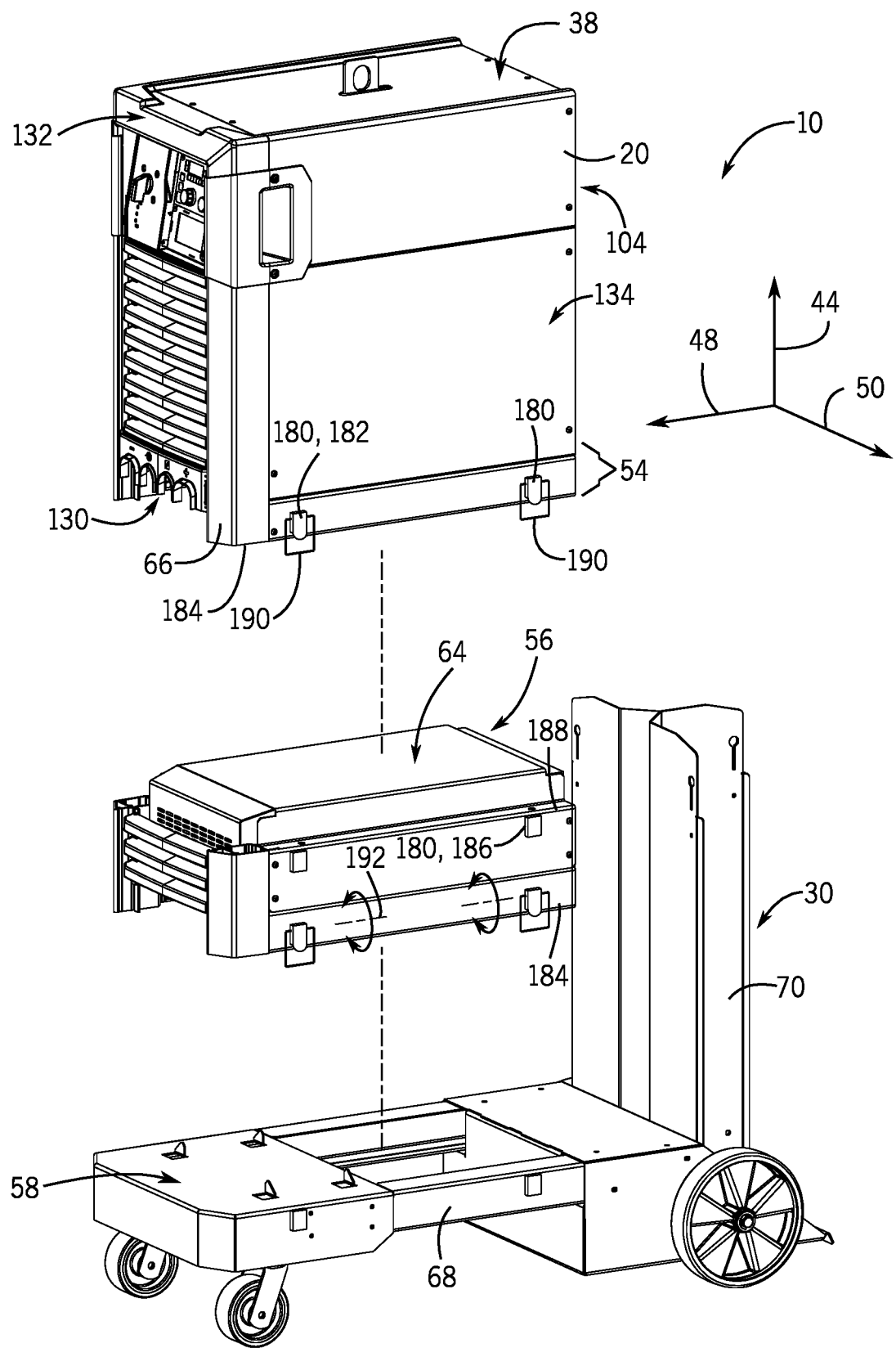
FIG. 7 is a perspective view of an embodiment of the modular welding system and one or more mating features between components of the modular welding system.

Embodiments of the wire feeder bottom housing 34 and the second housing surface 38 of the power supply 20 are not limited to the geometries and features described above and shown in FIGS. 3 and 4. FIGS. 5-7 illustrate embodiments of the power supply bottom housing 54, third housing surface 56 of the cooler 28, and fourth housing surface 58 of the transportation device 30. The mating geometries and features of the embodiments in FIGS. 5-7 may differ from the embodiments of FIGS. 3 and 4. However it may be appreciated that each modular component of the modular welding system 10 may utilize one or more of the mating geometries described herein and shown in FIGS. 3-7. For example, the rim 90, channel 92, and one or more flanges 96 described above with the wire feeder bottom housing 34 and the second housing surface 38 of the power supply 20 may be utilized to removably couple the power supply bottom housing 54 to the cooler 28 and/or to the transportation device 30.

FIG. 5 illustrates an assembly view of an embodiment of the modular welding system 10 in which the modular components have male-female mating features configured to form the modular welding system 10. The modular components (e.g., power supply 20, cooler 28, transportation device 30) may interlock with one another to restrict relative movement along the coordinate axes 44, 48, 50. In some embodiments, the power supply bottom housing 54 has one or more legs 66 (e.g., rails along the side surfaces 130, 134) that extend from a bottom surface 150 of the power supply 20. When the power supply bottom housing 54 removably couples to the third housing surface 56, the one or more legs 66 extend towards the recessed portion 62 of the cooler 28, and the raised portion of the third housing surface 56 extends towards the bottom surface 150. The arrangement of the recessed portion 62 and raised portion 64 of the lower modular component (e.g., transportation device 30, cooler 28) affect how the upper modular component (e.g., power supply 20, cooler 28) is restrained along the coordinate axes 44, 48, 50 when removably coupled to the lower modular component. As shown in FIG. 5, the legs 66 extending along the side surfaces 130, 134 (along the X-axis 48) of the power supply 20 into the recessed portion 62 of the cooler 28 may limit the movement of the power supply 20 along the Z-axis 50 relative to the cooler 28.

One or more posts 152 (e.g., dowels) may extend through one or both of the power supply 20 and the cooler 28 to position and retain the power supply 20 along the X-axis 48. The posts 152 may extend into the lower modular component, into the upper modular component, or any combination thereof. In some embodiments, the one or more posts 152 are a separate component inserted into recess 154 prior to assembly (e.g., stacking) of the modular welding system 10. Additionally, one or more fasteners 126 may be inserted through the second hole set 60 shared with the power supply 20, the cooler 28, and/or the transportation device 30. In FIG. 5, the second hole set 60 is accessible through one or more assembly ports 156.

In some embodiments, one or more snaps 158 of a modular component (e.g., transportation device 30) may interface with engagement portions 160 on surfaces 104, 130, 132, 134 of another modular component (e.g., power supply bottom housing 54, cooler 28). In some embodiments, the snaps 158 may include ball detents that are spring loaded to interface with the engagement portions 160. The snaps 158 may be biased toward the engagement portions 160 to limit the movement of the engaged modular component (e.g., power supply 20) relative to engaging modular component (e.g., cooler 28). In some embodiments, the snaps 158 are utilized with interlocking (e.g., nesting) modular components as shown in FIG. 5.

The mating features shown in FIG. 5 may passively couple the modular components of the modular welding system 10 to one another. That is, the male features (e.g., legs 66, extended portion 64, posts 152, snaps 158) and female features (e.g., bottom surface 150, recessed portion 62, recesses 154, engagement portions 160) may passively engage each other and restrict relative movement of modular components without manual engagement of a mating feature by the operator. For example, the operator may place the cooler 28 on the transportation device 30 along the vertical axis 44 with the posts 152 aligned with the recesses 154 to removably couple the cooler 28 to the transportation device 30. Passive coupling the modular components may reduce the time to assemble or disassemble the modular welding system 10. Additionally, the operator may assemble or disassemble some embodiments of the modular welding system 10 without utilizing tools (e.g., screwdriver, wrench).

As shown in FIG. 6, the power supply bottom housing 54 and/or the cooler 28 may removably couple with the fourth housing surface 58 of the transportation device 30 with hooking features 170. In some embodiments, the hooking features 170 of the power supply bottom housing 54 engage links 172 of the cooler 28 or the transportation device 30. The links 172 may be arranged within recesses 174 of the third and fourth housing surfaces 56, 58, or on the exterior housings of the cooler 28 or transportation device 30. Some embodiments of the hooking features 170 may passively engage the links 172 for tool-free attachment of the power supply 20 to the cooler 28 and/or transportation device 30.

FIG. 7 illustrates an embodiment of the power supply bottom housing 54 and/or the cooler 28 that may removably couple with the fourth housing surface 58 of the transportation device 30 with mounting hardware 180. The mounting hardware 180 may include, but is not limited to latches, straps, brackets, and so forth. The mounting hardware 180 may be arranged about the side surfaces 104, 130, 132, 134 of the modular component. In some embodiments, the mounting hardware 180 has a latch base 182 proximate to a bottom edge 184 of the upper modular component (e.g., power supply 20), and a catch 186 proximate to a top edge 188 of the lower modular component (e.g., cooler 28). The upper modular component is positioned to interface with the lower modular component and aligned so that the latch base 182 substantially aligns with the catch 186. Then the operator engages a latch 190 to the catch 186, removably coupling the upper modular component to the lower modular component. In some embodiments, engaging the latch 190 pulls the modular components together. The mounting hardware 180 is positioned at common locations of the modular components, thereby enabling the latch bases 182 and latches 190 of power supply 20 to engage with the catches 186 of either the cooler 28 or the transportation device 30.

The embodiments illustrated in FIGS. 3-7 disclose various mating geometries and mating features of the modular components of the modular welding system 10. Each of the modular components (e.g., wire feeder 12, swivel 18, power supply 20, cooler 28, transportation device 30) may be removably coupled to another modular component based at least in part on a shared mating geometry or mating feature. In some embodiments, the wire feeder 12 may couple directly with the cooler 28 and/or transportation device 30 separately from a power supply 20. Moreover, various form factors of the power supply 20 may removably couple with the wire feeder 12 and the cooler 28. Thus, in some embodiments various form factors of the components (e.g., wire feeder 12, power supply 20) are fully interchangeable with another component of the same type. Additionally, one or more of the mating features described above (e.g., lift eye 42, posts 152, legs 66) may couple and position the modular components so that one or more faces (e.g., front face 132) of the power supply 20, wire feeder 12, and cooler 28 are substantially flush with one another. Some embodiments of the modular welding system 10 may have a first mating relationship between some modular components (e.g., wire feeder 12, swivel 18, and second housing surface 38 of the power supply 20) and a second mating relationship between other modular components (e.g., power supply bottom housing 54, cooler 28, transportation device 30). Where the first mating relationship (e.g., flange and channel, nesting geometry, hole pattern, mounting hardware, or any combination thereof) is compatible with the second mating relationship, each component of the modular welding system 10 may be fully interchangeable with one another.

Moreover, FIGS. 2-4 illustrate various mating interfaces between the wire feeder 12 and the power supply 20, and FIGS. 5-7 illustrate various mating interfaces between the power supply 20 and the cooler 28 or transportation device 30. Some embodiments of the power supply 20 may couple with the cooler 28 or transportation device 30 via one or more of the mating relationships (e.g., flange 96 and channel 92, nesting geometries, hole pattern 40) shown in FIGS. 2-4. In a similar manner, some embodiments of the power supply 20 may couple with the wire feeder 12 or swivel 18 via one or more of the mating relationships (e.g., nesting geometry, posts 152, hole pattern 60, snaps 158, hook feature 170, mounting hardware 180) shown in FIGS. 5-7. Furthermore, the present disclosure is not limited to the male-female relationships illustrated in FIGS. 1-7. Specifically, presently contemplated embodiments include the opposite mating geometries and any combinations of the male-female relationships described above that facilitate the modular arrangement of the modular components into a modular welding system 10. For example, some embodiments of the power supply bottom housing 54 may have a raised portion 64 and a recessed portion 62 that mates (e.g., nests) with legs 66 and a top surface of the cooler 28, which is substantially the opposite of the mating relationship shown in FIG. 5.

Figure 8:
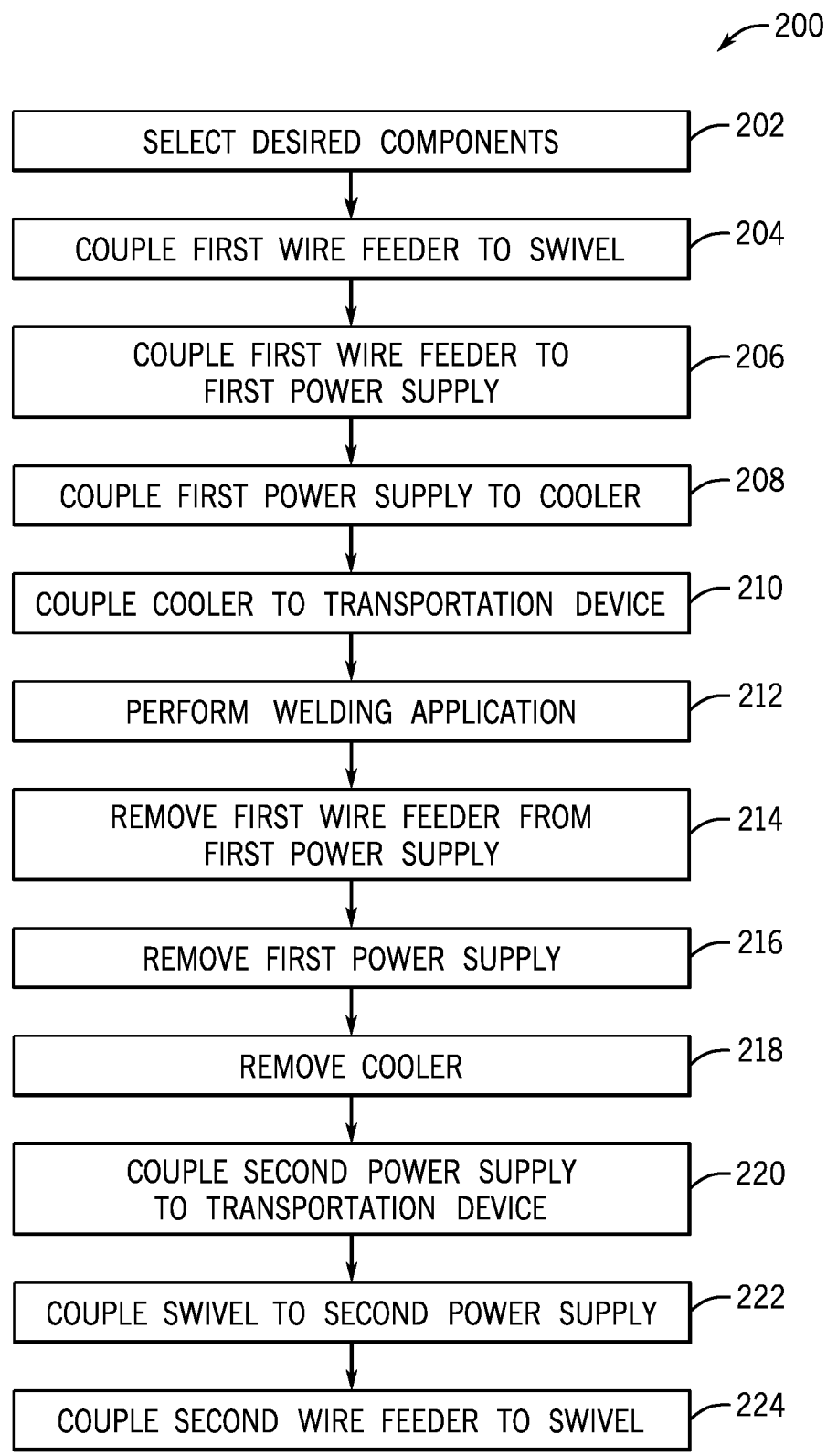
FIG. 8 is a flow chart of a method for assembling the modular welding system.

FIG. 8 is a flowchart of a method 200 of assembling the modular welding system described above. Being a modular welding system, the modular components may be arranged in a variety of configurations. The method 200 provides an example of how an operator may utilize the modular welding system and switch modular components. However, the modular welding system may be assembled and reassembled by other methods as described above. The operator selects (block 202) the desired modular components to be assembled into the modular welding system. For example, the operator may select the single-wire wire feeder for a typical welding application utilizing a single type of electrode, and the dual-wire wire feeder for a relatively complex welding application that specifies different types of welds. In some embodiments, the operator may then couple (block 204) the first wire feeder to a swivel. The first wire feeder and swivel may be removably coupled to one another via one or more of the mating geometries and mating features described above. The first wire feeder is then coupled (block 206) by the mating geometry to the selected first power supply via the swivel. Similarly, the swivel may be removably coupled to the first power supply via one or more of the mating geometries and mating features described above, such as the lift eye. In some embodiments, the mating geometries coupling the swivel to the first wire feeder and to the first power supply may be substantially complementary.

After the first power supply is coupled with the first wire feeder, the first power supply may be coupled (block 208) to the cooler. The first power supply and the cooler may be removably coupled to one another via one or more of the mating geometries and mating features described above. The first power supply is then coupled (block 210) to the selected transportation device via the cooler. Similarly, the cooler may be removably coupled to the transportation device via one or more of the mating geometries and mating features described above. In some embodiments, the mating geometries coupling the cooler to the first power supply and to the transportation device may be substantially complementary. The method 200 above starts with the first wire feeder that may be positioned at the top of the modular welding system. Other embodiments of the method 200 may start with coupling the cooler to the transportation device at the bottom of the modular welding system.

The operator may perform (block 212) one or more welding applications utilizing the assembled modular welding system. After use of the modular welding system, the operator may desire to remove some modular components or exchange some modular components with others. The operator may remove (block 214) the first wire feeder and the swivel from the first power supply. The operator may also remove (block 216) the first power supply and remove (block 218) the cooler. The operator may couple (block 220) a second power supply to the selected transportation device with or without a cooler. The operator may then couple (block 222) the swivel to the second power supply, and couple (block 224) the second wire feeder to the second power supply via the swivel. Based at least in part on the modular components selected, the modular welding system after block 210 may have different capabilities and operating parameters than the modular welding system after block 224.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A wire feeder, comprising:
a wire drive configured to supply a welding wire to a welding tool; and
a wire feeder housing disposed about the wire drive, the wire feeder housing comprising a mating geometry configured to mate with a complementary geometry of a modular component of a welding system, wherein the mating geometry comprises:
a first flange extending from a first edge of a base of the wire feeder housing, and
a second flange extending from a second edge of the base of the wire feeder housing, and
an aperture in the base of the wire feeder housing, the aperture being configured for alignment with a lifting or alignment mechanism of a welding power supply.

2. The wire feeder of claim 1, wherein the mating geometry is part of a bottom of the wire feeder housing.

3. The wire feeder of claim 2, further comprising a door at a top of the wire feeder, opposite the bottom of the wire feeder.

4. The wire feeder of claim 1, wherein the wire feeder housing is configured to enclose a wire spool carrying the welding wire.

5. The wire feeder of claim 1, wherein the first flange extends outward from the first edge of the base in a first direction, and the second flange extends outward from the second edge of the base in a second direction, the second edge being opposite the first edge, the second direction being opposite the first direction, and the aperture being positioned between the first edge and the second edge.

6. The wire feeder of claim 1, wherein the modular component comprises one or more of a swivel, a welding power supply, a torch cooler, or a transportation device.

7. The wire feeder of claim 1, wherein the aperture comprises an elliptical aperture, and the major axis of the elliptical aperture is parallel with the first or second edge.

8. The wire feeder of claim 1, further comprising a plurality of apertures, the plurality of apertures comprising the aperture.

9. The wire feeder of claim 8, wherein the aperture comprises a first elliptical aperture having a first major axis, the plurality of apertures further comprising a second elliptical aperture having a second major axis that is parallel to the first major axis.

10. The wire feeder of claim 9, wherein the first major axis and second major axis are aligned.

11. A welding wire feeder, comprising:
a wire drive configured to supply a welding wire to a welding tool; and
a wire feeder housing disposed about the wire drive, the wire feeder housing comprising a top portion and a bottom portion opposite the top portion, the bottom portion comprising a mating geometry configured to mate with a complementary geometry of a modular component of a welding system, and
wherein the mating geometry comprises:
   a first flange extending from a first edge of a base of the wire feeder housing, and
   a second flange extending from a second edge of the base of the wire feeder housing, and
   an aperture in the base of the wire feeder housing, the aperture being configured for alignment with a lifting or alignment mechanism of a welding power supply.

12. The wire feeder of claim 11, further comprising a door at a top of the wire feeder, opposite the bottom of the wire feeder.

13. The wire feeder of claim 12, wherein the door is configured to open to provide access to a wire spool within an interior of the wire feeder.

14. The wire feeder of claim 11, wherein the mating geometry further comprises a third flange extending from the first edge of the base of the wire feeder housing, and a fourth flange extending from the second edge of the base of the wire feeder housing.

15. The wire feeder of claim 11, wherein the first flange extends outward from the first edge of the base in a first direction, and the second flange extends outward from the second edge of the base in a second direction, the second edge being opposite the first edge, the second direction being opposite the first direction, and the aperture being positioned between the first edge and the second edge.

16. The wire feeder of claim 11, wherein the modular component comprises one or more of a swivel, a welding power supply, a torch cooler, or a transportation device.

17. The wire feeder of claim 11, wherein the aperture comprises an elliptical aperture, and the major axis of the elliptical aperture is parallel with the first and second edge.

18. The wire feeder of claim 11, further comprising a plurality of apertures, the plurality of apertures comprising the aperture.

19. The wire feeder of claim 18, wherein the aperture comprises a first elliptical aperture having a first major axis, the plurality of apertures further comprising a second elliptical aperture having a second major axis that is parallel to the first major axis.

20. The wire feeder of claim 19, wherein the first major axis and second major axis are aligned.

* * * * *